(12) United States Patent
Yang et al.

(10) Patent No.: US 11,038,079 B2
(45) Date of Patent: Jun. 15, 2021

(54) LIGHT-EMITTING DEVICE AND MANUFACTURING METHOD THEREOF

(71) Applicant: KAISTAR Lighting (Xiamen) Co., Ltd., Xiamen (CN)

(72) Inventors: Hung-Chih Yang, Xiamen (CN); Xiao-Kun Lin, Xiamen (CN); Jian-Ran Huang, Xiamen (CN); Ben-Jie Fan, Xiamen (CN); Ho-Chien Chen, Xiamen (CN); Chan-Yang Lu, Xiamen (CN); Shuen-Ta Teng, Xiamen (CN); Cheng-Chang Hsieh, Xiamen (CN)

(73) Assignees: KAISTAR LIGHTING (XIAMEN) CO., LTD., Xiamen (CN); BRIDGELUX WUXI R&D CO., LTD., Wuxi (CN)

( * ) Notice: Subject to any disclaimer, the term of this patent is extended or adjusted under 35 U.S.C. 154(b) by 0 days.

(21) Appl. No.: 16/459,837

(22) Filed: Jul. 2, 2019

(65) Prior Publication Data
US 2019/0326469 A1    Oct. 24, 2019

(30) Foreign Application Priority Data
Aug. 17, 2018    (CN) .......................... 201810940704.5

(51) Int. Cl.
*H01L 33/00*    (2010.01)
*H01L 33/20*    (2010.01)
(52) U.S. Cl.
CPC .......... *H01L 33/0062* (2013.01); *H01L 33/20* (2013.01)

(58) Field of Classification Search
CPC ................. H01L 33/0062; H01L 33/20; H01L 33/00–648; H01L 27/15–156;
(Continued)

(56) References Cited

U.S. PATENT DOCUMENTS

| 2010/0099213 A1* | 4/2010 | Wu ........................ H01L 33/007 438/46 |
| 2014/0175474 A1 | 6/2014 | Han et al. |

(Continued)

FOREIGN PATENT DOCUMENTS

| CN | 103887383 A | 6/2014 |
| KR | 10-2013-0066308 A | 6/2013 |

OTHER PUBLICATIONS

China Patent Office, Office action dated May 24, 2019.

*Primary Examiner* — Shahed Ahmed
(74) *Attorney, Agent, or Firm* — Li & Cai Intellectual Property (USA) Office (57) ABSTRACT

A light-emitting device and a manufacturing method thereof are provided. The light-emitting device includes a substrate, an epitaxial blocking layer, and a light-emitting epitaxial structure. The substrate has a surface, in which the surface includes a plurality of protruding parts and a plurality of recess parts relative to the protruding parts. The epitaxial blocking layer disposed on the substrate covers the recess parts and exposes the protruding parts. The light-emitting epitaxial structure disposed on the substrate is connected to the protruding parts and is disposed above the recess parts. The light-emitting epitaxial structure is formed by using the protruding parts as a growth surface thereof so as to have a better crystalline quality.

6 Claims, 8 Drawing Sheets

(58) Field of Classification Search
CPC ..... H01L 2933/00–0091; H01L 25/075–0756; H01L 21/02647; H01L 21/02639; H01L 21/0243; H01L 33/007
See application file for complete search history.

(56) References Cited

U.S. PATENT DOCUMENTS

| | | | |
|---|---|---|---|
| 2015/0311389 A1* | 10/2015 | Lin | H01L 33/06 257/88 |
| 2017/0141266 A1* | 5/2017 | Hsu | H01L 33/007 |
| 2018/0138358 A1* | 5/2018 | Zhang | H01L 33/06 |
| 2018/0254380 A1* | 9/2018 | Muroo | H01L 33/16 |

* cited by examiner

LIGHT-EMITTING DEVICE AND MANUFACTURING METHOD THEREOF

CROSS-REFERENCE TO RELATED PATENT APPLICATION

This application claims the benefit of priority to China Patent Application No. 201810940704.5, filed on Aug. 17, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting device and a manufacturing method thereof, and more particularly to a light-emitting diode device and a manufacturing method thereof.

BACKGROUND OF THE DISCLOSURE

Conventional light emitting diode (LED) component includes a substrate and a plurality of semiconductor epitaxial layers formed on the substrate. For example, most of the conventional LED components including a plurality of epitaxial layers of III-V compound semiconductors usually use a sapphire substrate or a sapphire wafer to serve as a growth substrate for the formations of the semiconductor epitaxial layers.

Compared to the LED components that use a flat sapphire substrate, the LED components using a patterned sapphire substrate to grow the semiconductor epitaxial have a higher luminous efficiency. However, the surface of the patterned sapphire substrate includes a non-polar plane or a semi-polar plane (R-plane or M-plane), and a polar plane (C-plane). When the semiconductor epitaxial layer is formed on the patterned sapphire substrate, the grains growing from the non-polar plane and polar plane have different crystal directions.

Accordingly, parts of the semiconductor epitaxial layer growing on the patterned sapphire substrate are polycrystalline. Furthermore, the grains having different crystal directions may cause the semiconductor epitaxial layer to have an uneven surface and more defects, thereby negatively affecting the crystalline quality of the semiconductor epitaxial layer.

SUMMARY OF THE DISCLOSURE

In response to the above-referenced technical inadequacies, the present disclosure provides a light-emitting device and a manufacturing method thereof so as to improve the crystalline quality of the epitaxial layer.

In one aspect, the present disclosure provides a manufacturing method of a light-emitting device. The manufacturing method includes the steps of providing a substrate having a surface, the surface including a plurality of protruding parts and a plurality of recess parts relative to the protruding parts; forming an epitaxial blocking layer on the substrate, in which the epitaxial blocking layer covers the recess parts, and the protruding parts are exposed from the epitaxial blocking layer; and forming a light-emitting epitaxial structure on the substrate, in which the protruding parts serve as a growth surface of the light-emitting epitaxial structure.

In one aspect, the present disclosure provides a light-emitting device. The light-emitting device includes a substrate, an epitaxial blocking layer, and a light-emitting epitaxial structure. The substrate has a surface, and the surface includes a plurality of protruding parts and a plurality of recess parts relative to the protruding parts. The epitaxial blocking layer is disposed on the substrate and covers the recess parts. The protruding parts are exposed from the epitaxial blocking layer. The light-emitting epitaxial structure is disposed on the structure, connected to the protruding parts, and is disposed above the recess parts.

Therefore, in a manufacturing method of a light-emitting device of the embodiment of the present disclosure, by using the epitaxial blocking layer to cover the recess parts and to expose the protruding parts, only the protruding parts can serve as a growth surface of the light-emitting epitaxial structure so as to prevent the formation of the polycrystalline region in the light-emitting epitaxial structure, thereby decreasing the defects in the light-emitting epitaxial structure. As such, the crystalline quality of the light-emitting epitaxial structure can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
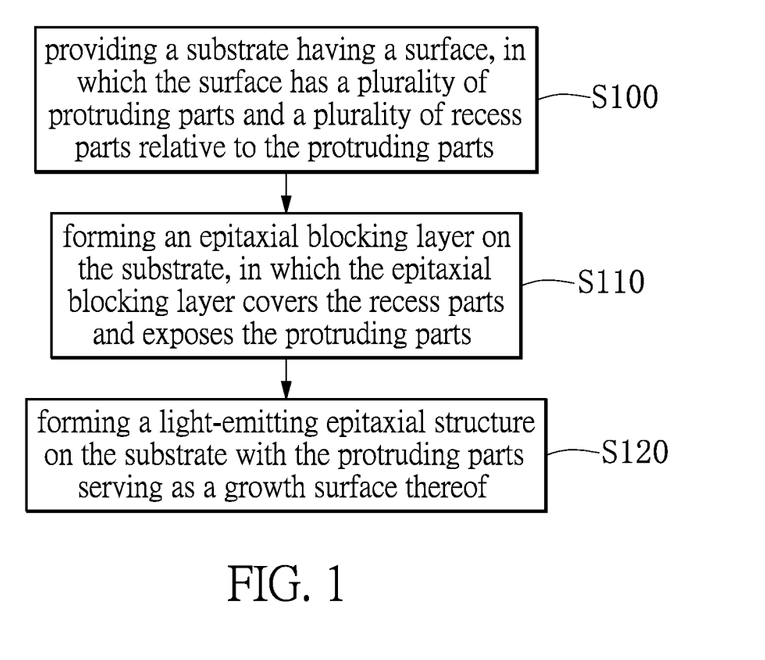
FIG. 1 is a flowchart of a manufacturing method of a light-emitting device according to one embodiment of the present disclosure.

Reference is made to FIG. 1, which is a flowchart of a manufacturing method of a light-emitting device according to one embodiment of the present disclosure. The light-emitting device is, for example, a light-emitting diode. In the embodiment of the present disclosure, a manufacturing method of a light-emitting device at least includes the following steps.

In step S100, a substrate having a surface is provided, in which the surface has a plurality of protruding parts and a plurality of recess parts relative to the protruding parts. In step S110, an epitaxial blocking layer is formed on the substrate, in which the epitaxial blocking layer covers the recess parts and exposes the protruding parts. In step S120, a light-emitting epitaxial structure is formed on the substrate with the protruding parts serving as a growth surface thereof.

Reference is made to FIG. 2A to FIG. 2H, which respectively show the schematic sectional views of a light-emitting device in different steps of the manufacturing method according to a first embodiment of the present disclosure.

Figure 2A:
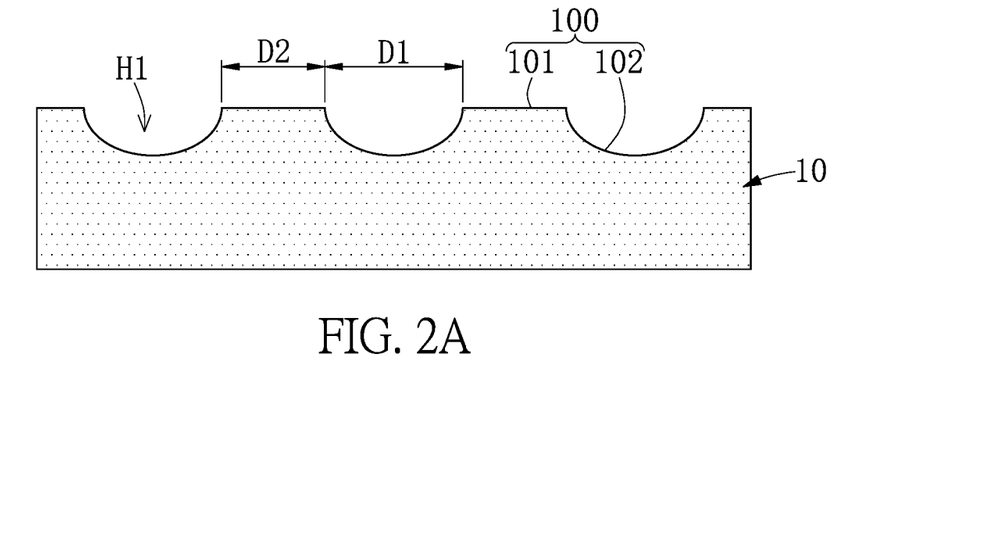
FIG. 2A is a schematic sectional view of a substrate according to a first embodiment of the present disclosure.

FIG. 2A shows a sectional view of a substrate 10 according to one embodiment of the present disclosure. In one embodiment, the substrate 10 is a single crystalline substrate, and the substrate 10 can be made of any material that is suitable for epitaxial growth, such as sapphire, silicon carbide, gallium nitride, or silicon.

In the instant embodiment, the substrate 10 is a patterned substrate. That is to say, one of the surfaces of the substrate 10 is an uneven surface 100 including a plurality of protruding parts 101 and a plurality of recess parts 102 relative to the protruding parts 101. Each of the protruding parts 101 is immediately adjacent to at least one of the recess parts 102, and each of the recess parts 102 defines a space H1.

Specifically, an etching process, such as a dry etching process or a wet etching process, can be performed on the substrate 10 so as to form a plurality of trenches or recesses on the surface of the substrate 10. In another aspect, by performing the etching process, the surface of the substrate 10 can be formed with a plurality of protruding strips which are parallelly arranged or a plurality of protruding mesas which are arranged in a matrix.

Reference is made to FIG. 2A. Each of the protruding parts 101 is a flat plane to serve as a growth surface during the following epitaxial growth. For example, when the substrate 10 is a sapphire substrate, the crystal plane of the protruding part 101 is a polar plane, i.e., a C-plane. Furthermore, each of the recess parts 102 is a curved surface which may include the other crystal planes, such as an R-plane or an M-plane, thereby being improper for epitaxial growth.

In the instant embodiment, by performing the etching process on the substrate, the surface of the substrate 10 is formed with a plurality of recesses. Accordingly, each of the recess parts 102 is a curved surface.

In another embodiment, by performing the etching process on the substrate, the substrate 10 includes a plurality of protruding mesas arranged in a matrix. The top-viewed shape of each of the protruding mesas is not limited, and can be circular, triangular, or polygonal. Furthermore, the top surface of each of the protruding mesas is a flat plane and defined as the protruding parts 101. In other words, as viewed from a top side, the protruding parts 101 are arranged in a matrix and disconnected from one another.

On the other hand, the other parts of the protruding mesas are defined as the recess parts 102. That is to say, the protruding parts 101 are arranged in a matrix, while the recess parts 102 include all of the surfaces adjoining with the protruding parts 101. Specifically, the recess parts 102 include the side surfaces of each of the protruding mesas and a bottom surface adjoining to the side surfaces of the protruding mesas.

Accordingly, in the present disclosure, as long as the protruding parts 101 can serve as the growth surface, the patterned substrate 10 can be formed to have different structures according to actual requirements. Therefore, in the present disclosure, the top views of the protruding parts 101 and the recess parts 102 are not limited.

Furthermore, as shown in FIG. 2A, in one sectional view of the substrate 10, any two adjacent protruding parts 101 are spaced apart from each other by a horizontal distance D1, and each of the protruding parts 101 has a width D2. In one embodiment, a ratio of the horizontal distance D1 to the width D2 ranges from 1 to 20. In one preferred embodiment, the ratio of the horizontal distance D1 to the width D2 ranges from 5 to 18. In one further preferred embodiment, the ratio of the horizontal distance D1 to the width D2 ranges from 10 to 15.

Figure 2B:
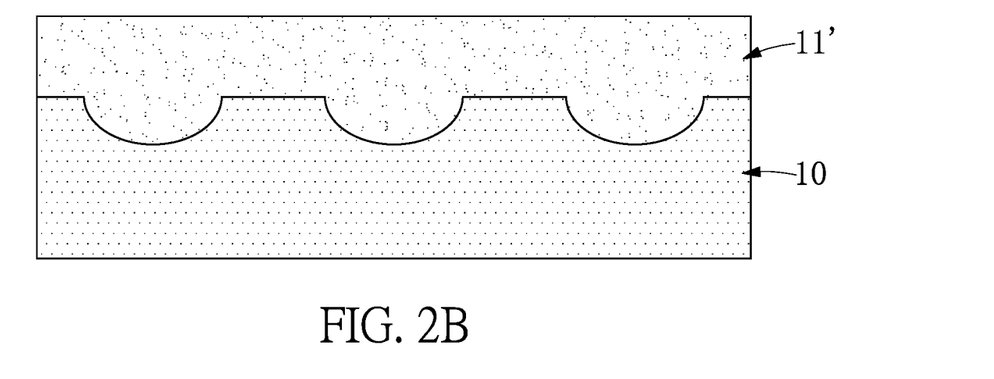
FIG. 2B is a schematic sectional view of a light-emitting device during the manufacturing method according to the first embodiment of the present disclosure.
Figure 2C:
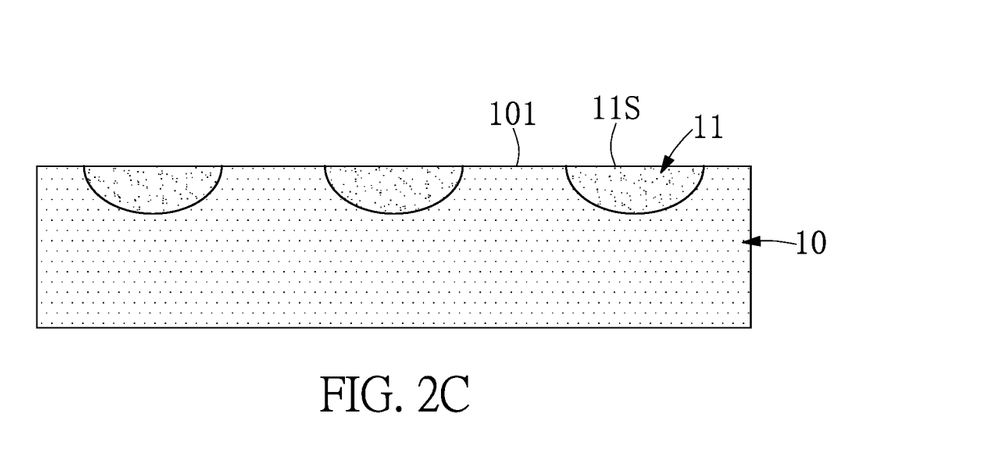
FIG. 2C is a schematic sectional view of the light-emitting device during the manufacturing method according to the first embodiment of the present disclosure.

Reference is made to FIG. 2B and FIG. 2C. An epitaxial blocking layer is formed on the substrate. As shown in FIG. 2B, in the instant embodiment, a dielectric material layer 11' is formed on the substrate 10, and the dielectric material 11' covers the surface 100 of the substrate 10. That is to say, the dielectric material layer 11' covers the protruding parts 101 and the recess parts 102. In the instant embodiment, the dielectric material layer 11' has a thickness greater than a depth of the space H1 which is defined by the recess part 102.

Reference is made to FIG. 2C, a portion of the dielectric material layer that covers the protruding parts 101 is removed, and the other portions that covers the recess parts 102 is retained so as to form the epitaxial blocking layer 11. Accordingly, the epitaxial blocking layer 11 only covers the recess parts 102 and exposes the protruding parts 101.

In the instant embodiment, by performing a grinding process, the portion of the dielectric material layer 11', a top surface of which is higher than the protruding parts 101, can be removed, while the other portions located in the spaces H1 can be retained. Accordingly, the epitaxial blocking layer 11 fills the space H1 defined by the recess parts 102.

The epitaxial blocking layer 11 has a non-growth surface 11S, i.e., the epitaxial blocking layer 11 will prevent an epitaxial layer from growing therefrom during the following epitaxial process. In the instant embodiment, the non-growth surface 11S is also flat and flush with the protruding parts 101 (the growth surface).

In another embodiment, the epitaxial blocking layer 11 can fill only a part of the space H1. That is to say, as long as the epitaxial blocking layer 11 completely covers the recess parts 102, whether the epitaxial blocking layer 11 fills the entire space H1 or not is not limited in the present disclosure.

Furthermore, the epitaxial blocking layer 11 can be made of a non-crystalline material, such as an amorphous material, having a lower refractive index. Specifically the refractive index of the epitaxial blocking layer 11 is lower than that of the substrate 10. For example, when the substrate 10 is a sapphire substrate, the refractive index of the substrate 10 is about 1.76. The epitaxial blocking layer 11 can be made of a material having a refractive index lower than 1.76, such as silicon oxide, lanthanum fluoride, lithium fluoride, magnesium fluoride and so on.

Figure 2D:
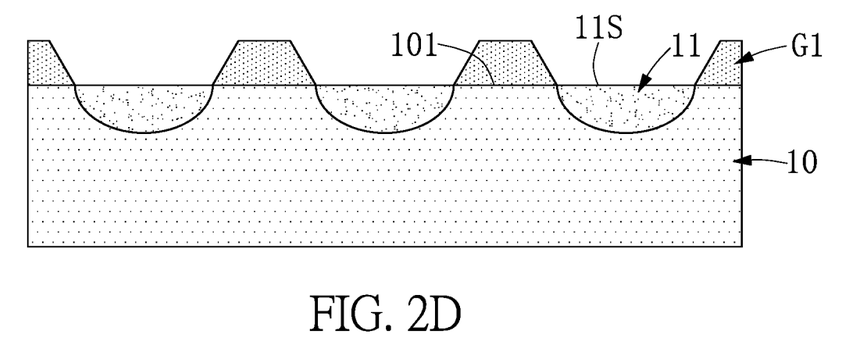
FIG. 2D is a schematic sectional view of the light-emitting device during the manufacturing method according to the first embodiment of the present disclosure.
Figure 2E:
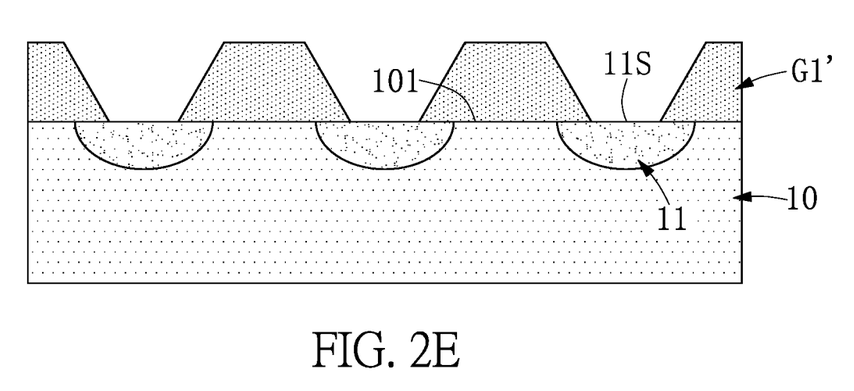
FIG. 2E is a schematic sectional view of the light-emitting device during the manufacturing method according to the first embodiment of the present disclosure.
Figure 2F:
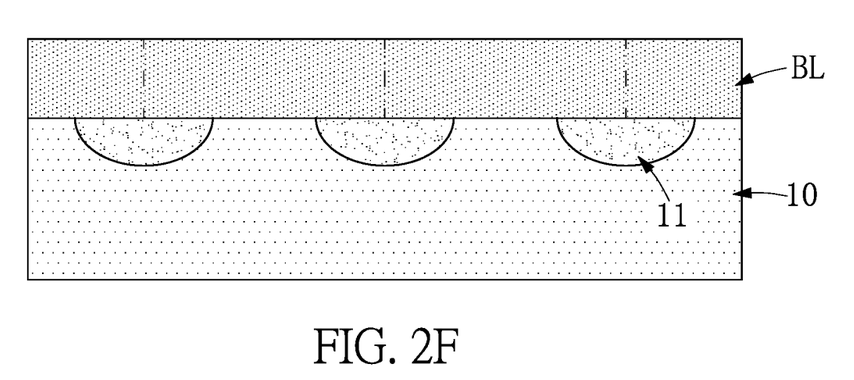
FIG. 2F is a schematic sectional view of the light-emitting device during the manufacturing method according to the first embodiment of the present disclosure.

Reference is made to FIG. 2D to FIG. 2H, which show details of forming a light-emitting epitaxial structure. As shown in FIG. 2D to FIG. 2F, in the instant embodiment, a buffer layer BL can be grown by using an epitaxial process. For example, the buffer layer BL can be a gallium nitride (GaN) layer.

Reference is made to FIG. 2D. During the epitaxial process, the initial grains G1 are formed only from the protruding parts 101, i.e., the growth surface, and not formed from the non-growth surface 11S of the epitaxial blocking layer 11 that covers the recess parts 102. Specifically, it is more difficult to grow the grains from the non-growth surface 11S. As time passes and the initial grains G1' grow, the initial grains G1 gradually extend toward the positions above the epitaxial blocking layer 11, as shown in FIG. 2E.

Thereafter, the grains formed from the protruding parts 101 combine with one another to form a seed layer.

In the manufacturing method of the instant embodiment, after the formation of the seed layer, the manufacturing method can further proceed to an annealing process so as to form a single-crystalline seed layer. Specifically, by heating the seed layer to a high temperature of at least 1000° C., the parts of the seed layer with a poor crystalline quality can be eliminated so that the seed layer has a single crystalline structure.

Reference is made to FIG. 2F. The epitaxial process is performed so that the single-crystalline seed layer can continuously grow to form the buffer layer BL. In one embodiment, the single-crystalline seed layer can serve as a crystal nucleus for growth of the buffer layer BL. By performing the aforementioned annealing process, the crystalline quality of the buffer layer BL can be further improved.

Figure 2G:
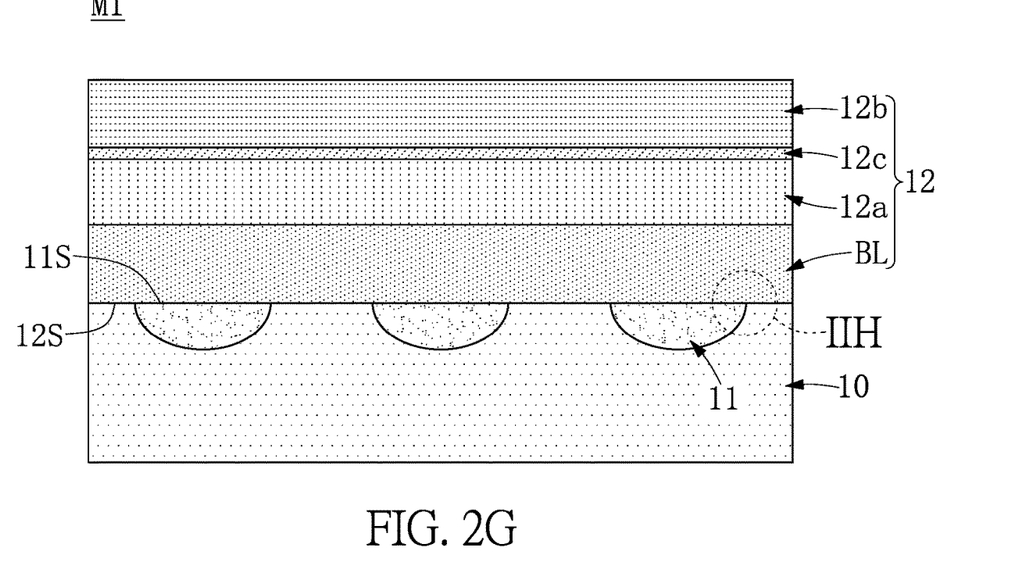
FIG. 2G is a schematic sectional view of the light-emitting device during the manufacturing method of the first embodiment of the present disclosure.

Reference is made to FIG. 2G A first conductivity type semiconductor layer 12a, an active layer 12c, and a second conductivity type semiconductor layer 12b are formed on the buffer layer BL so as to form a light-emitting epitaxial structure 12. The active layer 12c is disposed between the first and second conductivity type semiconductor layers 12a, 12b and includes a single or multiple quantum wells. In one embodiment, the material of the light-emitting epitaxial structure 12 can be selected from group III-V compounds, such as gallium nitride (GaN), gallium arsenide (GaAs), aluminum phosphide (AlP), and so on.

As shown in FIG. 2Q a light-emitting device M1 fabricated by the manufacturing method according to one embodiment of the present disclosure includes the substrate 10, the epitaxial blocking layer 11 and the light-emitting epitaxial structure 12. The surface 100 of the substrate 10 includes a plurality of protruding parts 101 and a plurality of recess parts 102 relative to the protruding parts 101. The epitaxial blocking layer 11 disposed on the substrate 10 covers the recess parts 102 and exposes the protruding parts 101.

The light-emitting epitaxial structure 12 is disposed on the substrate 10. The light-emitting epitaxial structure 12 is connected to the protruding parts 101 and is disposed above the recess parts 102. To be more specific, the recess parts 102 are isolated from the light-emitting epitaxial structure 12 by the epitaxial blocking layer 11.

Furthermore, the light-emitting epitaxial structure 12 includes the buffer layer BL, the first conductivity type semiconductor layer 12a, the active layer 12c, and the second conductivity type semiconductor layer 12b. The active layer 12c is disposed between the first and second conductivity type semiconductor layers 12a, 12b.

In the embodiment of the present disclosure, by using the epitaxial blocking layer 11 to cover the recess parts 102 of the substrate 10 and only using the protruding parts 101 to grow the light-emitting epitaxial structure 12, the substrate 10 can be prevented from having different crystal planes in different parts, thereby avoiding the formations of the polycrystalline regions in the buffer layer BL and decreasing the internal defects of the buffer layer BL. As such, the light-emitting epitaxial structure 12 which is epitaxially formed from the buffer layer BL can have a better crystalline quality, thereby improving the luminous efficiency thereof.

Furthermore, since the refractive index of the epitaxial blocking layer 11 is lower than that of the substrate 10, it is easier for the light generated from the active layer 12c and projecting to the epitaxial blocking layer 11 to be reflected back to a light-emergent side, i.e., the second conductivity type semiconductor layer 12b. That is to say, the loss of the light generated in the light-emitting epitaxial structure 12 can be attenuated, thereby improving the luminous efficiency of the light-emitting device M1.

Figure 2H:
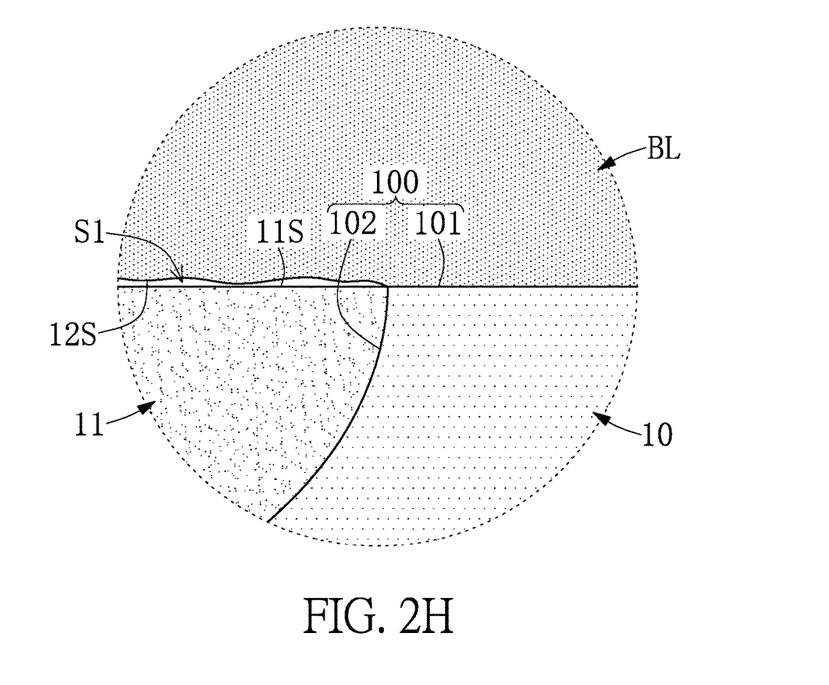
FIG. 2H is an enlarged view of the region IIH shown in FIG. 2G

Reference is made to FIG. 2H, which is an enlarged view of the region IIH shown in FIG. 2G It should be noted that as mentioned above, during the initial growth stage of the buffer layer BL, the initial grains G1, which are respectively formed from the protruding portions 101 of the substrate 10, substantially grow along a vertical direction. Thereafter, as the grains grow and laterally extend, the lateral sides thereof combine with one another. Accordingly, during the epitaxial process, it is difficult for the grains to be formed from the non-growth surface 11S of the epitaxial blocking layer 11.

Accordingly, after the lateral sides of the initial grains G1 combine with one another to form the buffer layer BL, a bottom surface of the buffer layer BL, i.e., the bottom surface 12S of the light-emitting epitaxial structure 12, may not be in complete contact with the non-growth surface 11S. Accordingly, as shown in FIG. 2H, at least one pore S1 (more than one pores are shown in FIG. 2H) exists between the bottom surface 12S of the light-emitting epitaxial structure 12 and the non-growth surface 11S.

Since the pore S1 is filled with air medium, and the refractive index of the air medium is lower than that of the substrate 10, when the light generated by the active layer 12c projects to the pore S1, the light can be easily reflected back to the light emergent side of the light-emitting epitaxial structure 12, thereby improving the luminous efficiency of the light-emitting device M1.

Figure 3:
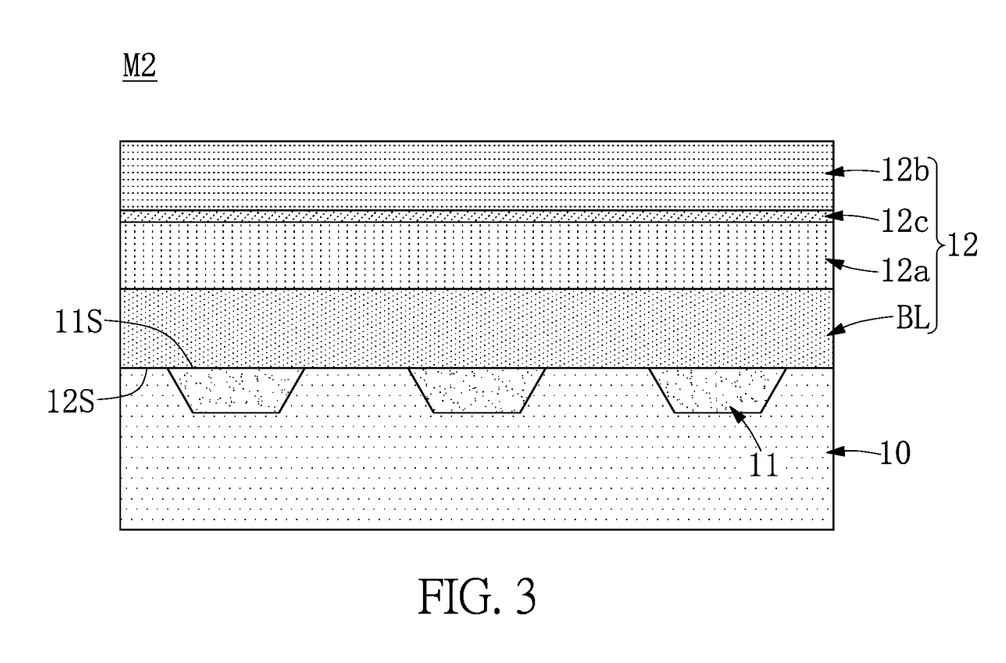
FIG. 3 is a schematic sectional view of a light-emitting device according to a second embodiment of the present disclosure.

Reference is made to FIG. 3, which is a schematic sectional view of a light-emitting device according to a second embodiment of the present disclosure. The elements which are similar to or the same as those shown in FIG. 2G are denoted by similar or the same reference numerals. In the instant embodiment of the present disclosure, the patterned substrate 10 with different structure is applied in the light-emitting device M2.

In the instant embodiment, an etching process can be performed so that the substrate 10 has a plurality of protruding strips and a plurality of trenches, which are alternately arranged. The top surface of each of the protruding strips is a flat plane and defined as the protruding part 101. The sidewall (i.e., the side surfaces of the protruding strips) and a bottom surface of each of the trenches are defined as the recess parts 102. In a top view of the substrate 10, the protruding parts 101 are disconnected from one another, and the internal spaces of the trenches are not in fluid communication with one another.

Furthermore, each of the recess parts 102 of the instant embodiment includes two inclined surfaces facing each other and a flat bottom surface connected between the two inclined surfaces. In the instant embodiment, the crystal plane of the flat bottom surface is the same as that of the protruding parts 101, for example, both of them are C-planes. However, the flat bottom surface of each of the recess parts 102 is still covered by the epitaxial blocking layer 11 and not used to grow any epitaxial layer.

Reference is made to FIG. 4A to FIG. 4F, which show the schematic sectional views of a light-emitting device during the manufacturing method according to a third embodiment of the present disclosure. The elements which are similar to or the same as those shown in FIG. 2G are denoted by similar or the same reference numerals.

Figure 4A:
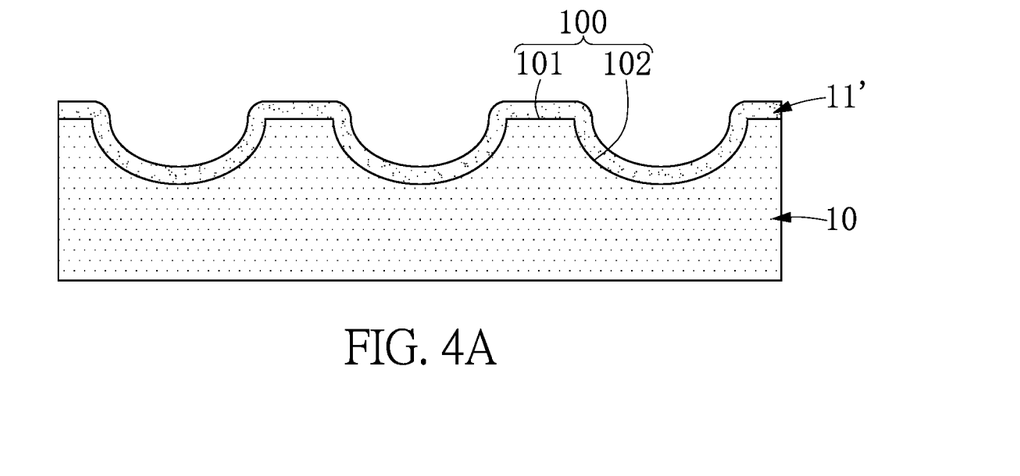
FIG. 4A is a schematic sectional view of a light-emitting device during the manufacturing method according to a third embodiment of the present disclosure.

Reference is made to FIG. 4A. The substrate 10 is the same as that shown in FIG. 2A in structure. The surface 100 of the substrate 10 includes a plurality of protruding parts 101 and a plurality of recess parts 102. Furthermore, in the instant embodiment, the dielectric material layer 11' conformingly covers the surface 100 of the substrate 10. That is to say, the dielectric material layer 11' has a surface having a contour that corresponds with that of the surface 100 of the substrate 10.

Figure 4B:
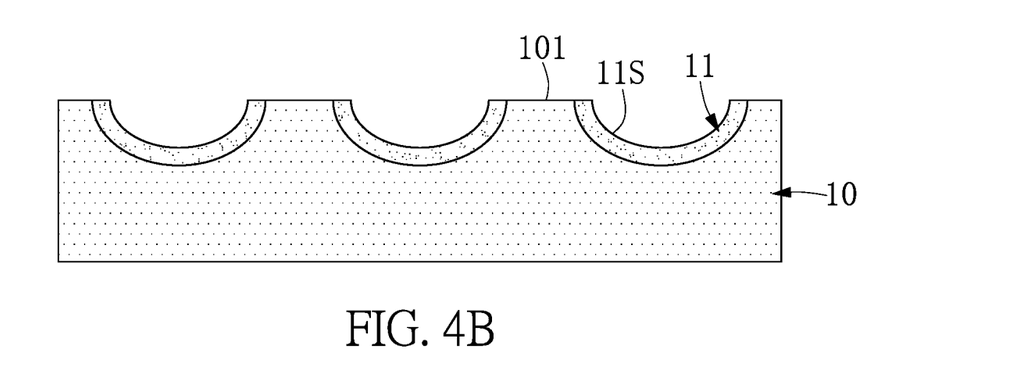
FIG. 4B is a schematic sectional view of the light-emitting device during the manufacturing method according to the third embodiment of the present disclosure.

Reference is made to FIG. 4B. A portion of the dielectric material layer 11' that covers the protruding parts 101 is removed, while the other portions that cover the recess parts 102 is retained so as to form the epitaxial blocking layer 11. Specifically, the portion of the dielectric material layer 11' that covers the protruding parts 101 can be removed by performing an etching process.

Furthermore, it should be noted that the epitaxial blocking layer 11 of the instant embodiment does not fill the entire space H1 that is defined by each of the recess parts 102. Accordingly, the surface of the epitaxial blocking layer 11, i.e., the non-growth surface, is a curved surface and has a contour that corresponds with that of the recess parts 102.

Figure 4C:
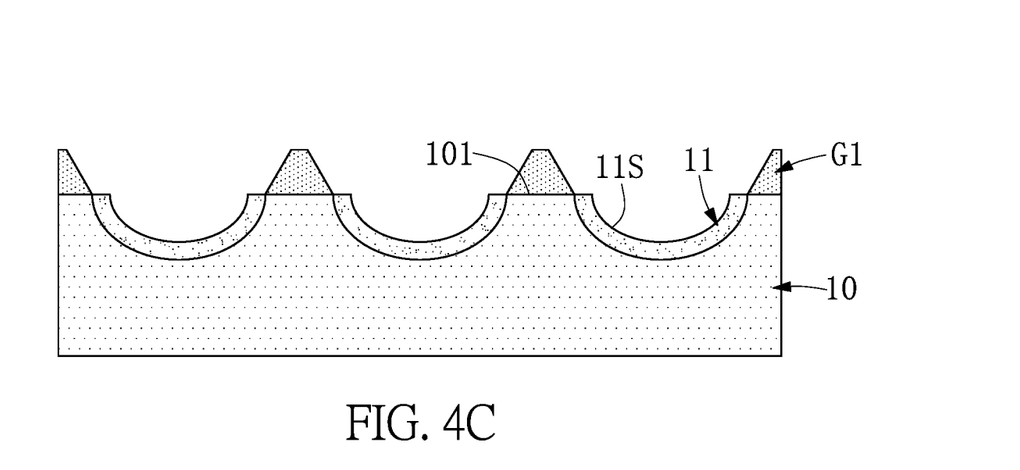
FIG. 4C is a schematic sectional view of the light-emitting device during the manufacturing method according to the third embodiment of the present disclosure.
Figure 4D:
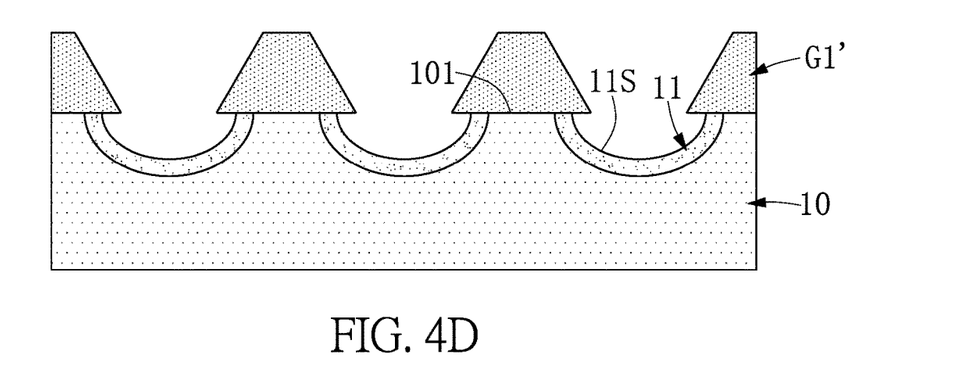
FIG. 4D is a schematic sectional view of the light-emitting device during the manufacturing method according to the third embodiment of the present disclosure.
Figure 4E:
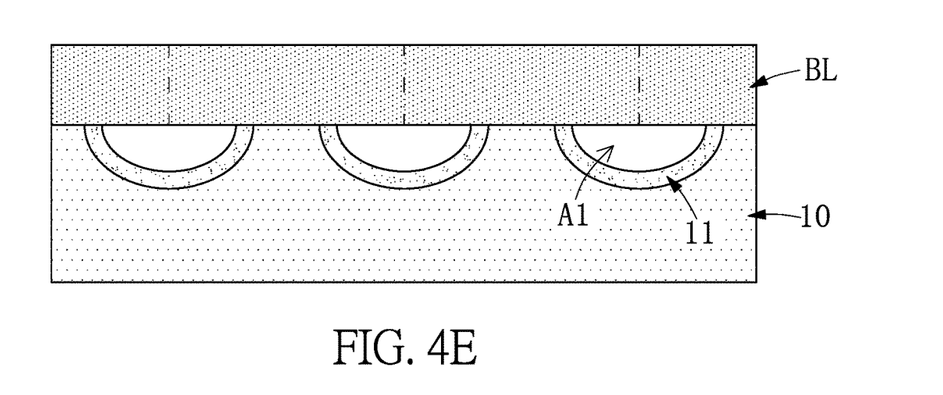
FIG. 4E is a schematic sectional view of the light-emitting device during the manufacturing method according to the third embodiment of the present disclosure.

Reference is made to FIG. 4C to FIG. 4E. The buffer layer BL is formed on the substrate 10. As shown in FIG. 4C, when the epitaxial process is performed, the initial grains G1 are formed only from the protruding parts 101, i.e., the growth surface, and not formed from the non-growth surface 11S of the epitaxial blocking layer 11. As time passes, the initial grains G1 grow and gradually extend toward the positions above the epitaxial blocking layer 11, as shown in FIG. 4D.

Thereafter, the grains G1' that are respectively formed from the protruding parts 101 contact and combine with one another to form the buffer layer BL, as shown in FIG. 4E. Moreover, the buffer layer BL closes off each of the spaces H1. The details of forming the buffer layer BL can be referred to in the descriptions related to FIGS. 2D to 2F, and will be not reiterated herein.

It is worth mentioning that it is more difficult for the grains to grow from the epitaxial blocking layer 11, i.e., the non-growth surface 11S. Accordingly, a portion of the bottom surface of the buffer layer BL is not in contact with the epitaxial blocking layer 11 so that a plurality of voids A1 exist between the buffer layer BL and the epitaxial blocking layer 11.

Figure 4F:
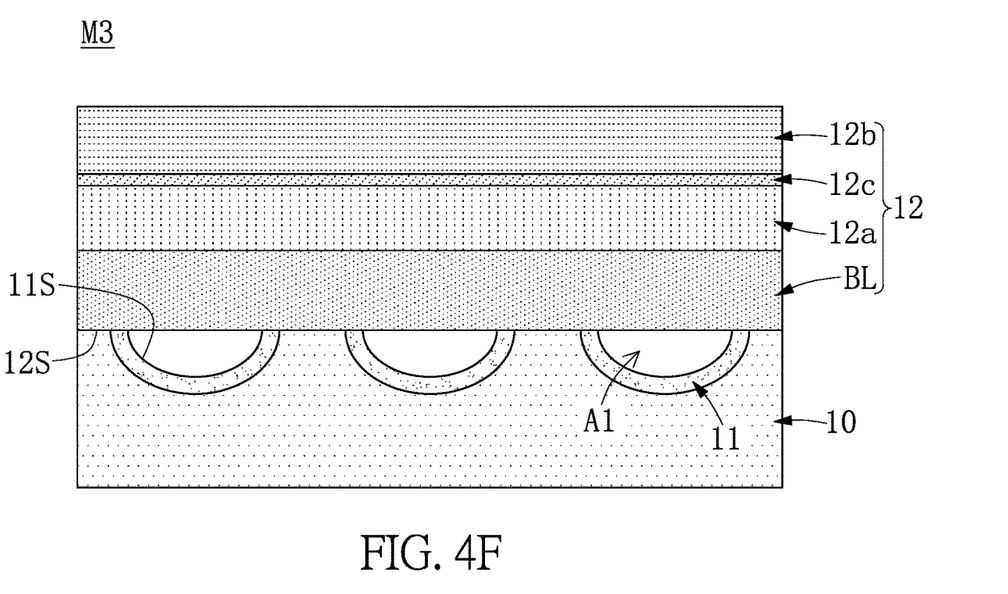
FIG. 4F is a schematic sectional view of the light-emitting device according to the third embodiment of the present disclosure.

Similar to the first embodiment shown in FIG. 2Q the first conductivity type semiconductor layer 12a, the active layer 12c, and the second conductivity type semiconductor layer 12b are formed on the buffer layer BL so as to form the light-emitting epitaxial structure 12.

Accordingly, in the light-emitting device M3 of the instant embodiment, the non-growth surface 11S of the epitaxial blocking layer 11 is a curved surface, and a portion of the bottom surface (i.e., the bottom surface of the buffer layer BL) of the light-emitting epitaxial structure 12 is not completely in contact with the non-growth surface 11S so that the voids A1 are defined therebetween.

Since the voids A1 are filled with air medium, the air medium is interposed between the buffer layer BL of the light-emitting epitaxial structure 12 and the epitaxial blocking layer 11. Furthermore, the refractive index of the air medium is lower than that of the substrate 10. Accordingly, the light generated by the active layer 12c and projecting to the voids A1 is more easily reflected back to the light emergent side of the light-emitting epitaxial structure, thereby improving the luminous efficiency of the light-emitting device M3.

Figure 5:
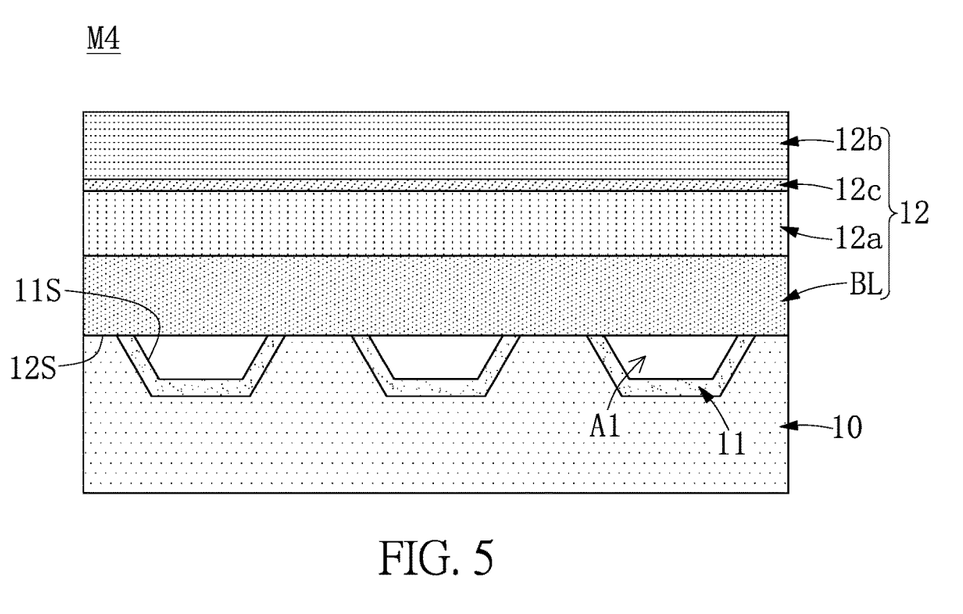
FIG. 5 is a schematic sectional view of the light-emitting device according to a fourth embodiment of the present disclosure.

Reference is made to FIG. 5, which is a schematic sectional view of the light-emitting device according to a fourth embodiment of the present disclosure. The substrate 10 applied in the light-emitting device M4 of the instant embodiment is the same as that applied in the light-emitting device M2 shown in FIG. 3. However, the epitaxial blocking layer 11 does not fill the entire space defined by each of the recess parts 102. Accordingly, a portion of the bottom surface of the light-emitting epitaxial structure 12 is not completely in contact with the non-growth surface 11S so that the voids A1 are defined therebetween.

In conclusion, in a manufacturing method of a light-emitting device of the embodiment of the present disclosure, by using the epitaxial blocking layer 11 to cover the recess parts 102 and to expose the protruding parts 101, only the protruding parts 101 serve as the growth surface of the light-emitting epitaxial structure 12 so as to prevent the formation of the polycrystalline region in the light-emitting epitaxial structure 12, thereby decreasing the defects in the light-emitting epitaxial structure 12. As such, the light-emitting device of the present disclosure has a better crystalline quality.

Furthermore, since the refractive index of the epitaxial blocking layer 11 is lower than that of the substrate 10, the light generated by the active layer 12c projecting to the epitaxial blocking layer 11 is more easily reflected back to the light emergent side, i.e., the second conductivity type semiconductor layer 12b. That is to say, it is not easy for the light generated in the light-emitting epitaxial structure 12 to enter the substrate 10, and the light loss can be prevented, thereby improving the luminous efficiencies of the light-emitting devices M1-M4.

On the other hand, by using the protruding parts 101 as the growth surface of the light-emitting epitaxial structure 12, the pores S1 or voids A1 are easily formed between the light-emitting epitaxial structure 12 and the epitaxial blocking layer 11. Since the pores S1 or the voids A1 are filled with air medium, the refractive index of which is lower than that of the substrate 10, the light generated in the light-emitting epitaxial structure 12 can be further prevented from entering the substrate 10, and the light loss can be reduced. As such, the luminous efficiencies of the light-emitting devices M1-M4 can be further enhanced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting device comprising:
   a substrate having a surface, wherein the surface includes a plurality of protruding parts and a plurality of recess parts relative to the protruding parts;
   an epitaxial blocking layer disposed on the substrate, wherein the epitaxial blocking layer covers the recess parts and exposes the protruding parts; and
   a light-emitting epitaxial structure disposed on the substrate, wherein the light-emitting epitaxial structure is connected to the protruding parts and is disposed above the recess parts;
   wherein the protruding parts serve as a growth surface of the light-emitting epitaxial structure, the recess parts respectively define a plurality of spaces, the epitaxial blocking layer fills each of the spaces and has a non-growth surface, and the growth surface is flush with the non-growth surface.

2. The light-emitting device according to claim 1, wherein at least one pore exists between a bottom surface of the light-emitting epitaxial structure and the non-growth surface.

3. The light-emitting device according to claim 1, wherein the non-growth surface is a curved surface, and a plurality of voids are defined between a portion of a bottom surface of the light-emitting epitaxial structure and the non-growth surface.

4. The light-emitting device according to claim 1, wherein a refractive index of the epitaxial blocking layer is smaller than that of the substrate.

5. The light-emitting device according to claim 1, wherein the epitaxial blocking layer completely covers the surfaces of the recess parts.

6. A light-emitting device comprising:
   a substrate having a surface, wherein the surface includes a plurality of protruding parts and a plurality of recess parts relative to the protruding parts;
   an epitaxial blocking layer disposed on the substrate, wherein the epitaxial blocking layer covers the recess parts and exposes the protruding parts; and
   a light-emitting epitaxial structure disposed on the substrate, wherein the light-emitting epitaxial structure is connected to the protruding parts and is disposed above the recess parts;
   wherein any two adjacent protruding parts are spaced apart from each other by a horizontal distance in a cross section of the substrate, and a ratio of the horizontal distance to a width of each of the protruding parts ranges from 1 to 20.

* * * * *